United States Patent
Nomura et al.

[11] Patent Number: 6,130,747
[45] Date of Patent: Oct. 10, 2000

[54] METHOD OF MEASURING ABERRATIONS OF LENS

[75] Inventors: Hiroshi Nomura, Kawasaki; Kazuya Sato, Yokohama, both of Japan

[73] Assignee: Kabushiki Kaisha Toshiba, Kawasaki, Japan

[21] Appl. No.: 09/251,997

[22] Filed: Feb. 18, 1999

[30] Foreign Application Priority Data

Feb. 19, 1998 [JP] Japan .................................. 10-037473

[51] Int. Cl.$^7$ .................................................. G01N 21/00
[52] U.S. Cl. ..................................... 356/239.2; 356/239.3
[58] Field of Search ............................... 356/239.2, 239.3

[56] References Cited

U.S. PATENT DOCUMENTS 5,615,006  3/1997  Hirukawa et al. ...................... 356/124
5,733,687  3/1998  Tanaka et al. ................................ 430/5

FOREIGN PATENT DOCUMENTS 11-044609  2/1999  Japan .

OTHER PUBLICATIONS

Hiroshi Nomura and Takashi Sato, "Overlay Error Due To Lens Coma and Asymmetric Illumination Dependence on Pattern Feature", Feb. 23–25, 1998, Proc. SPIE, vol. 3332, pp. 199–210.

*Primary Examiner*—Robert Kim
*Assistant Examiner*—Philip Natividad
*Attorney, Agent, or Firm*—Finnegan, Henderson, Farabow, Garrett & Dunner, L.L.P.

[57] ABSTRACT

A method of measuring the aberrations of a projection lens is disclosed. In this method, a photo-mask is irradiated with an illumination beam through an illumination optics, an inspection mark which comprises a periodic pattern on the photo-mask is imaged on a substrate through a projection optics, and a measurement mark which comprises a periodic pattern corresponding to the periodic pattern of the inspection mark is provided on the substrate. A period P of the periodic pattern of the measurement mark satisfies the following condition:

$$\lambda/\{NA(1-\sigma)\} \leq P \leq 3\lambda/\{NA(1+\sigma)\}$$

The measurement mark is measured, and the aberrations of the projection lens are estimated on the basis of the measurement result.

14 Claims, 12 Drawing Sheets

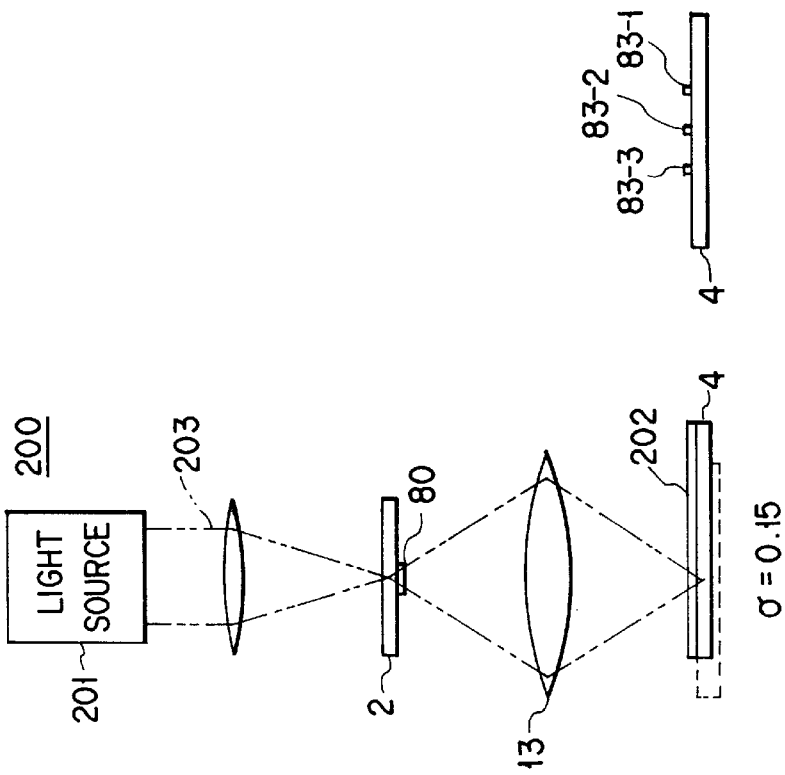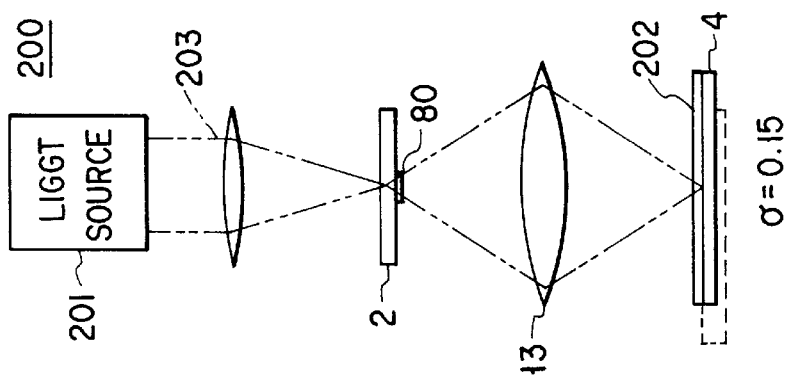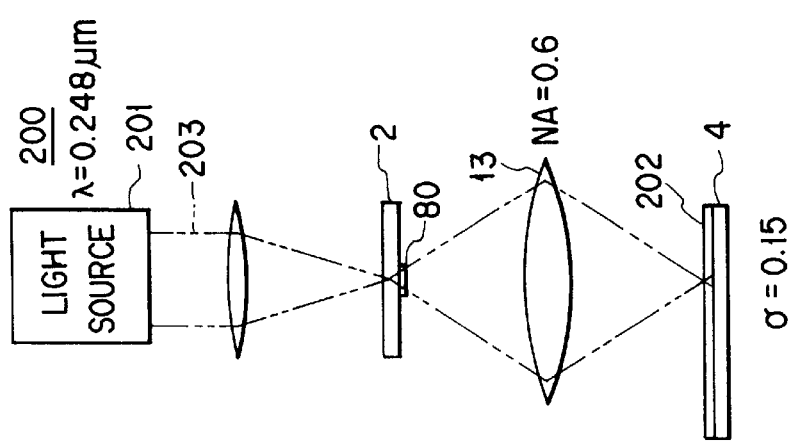

METHOD OF MEASURING ABERRATIONS OF LENS

BACKGROUND OF THE INVENTION

The present invention relates to a method of measuring the aberrations of a lens and, more particularly, to a method of measuring the aberrations of the projection lens of a reduction-type projection exposure tool.

A reduction-type projection exposure tool is used in the manufacturing process, especially in the lithography step, for a semiconductor device. Various methods of measuring the aberrations of the projection lens of this tool have recently been proposed. Some methods are actually used to estimate aberrations.

Typical aberrations of projection lenses are spherical aberration, astigmatism, and coma.

Spherical aberration is a phenomenon in which the best focus shifts depending on the size of a pattern to be transferred. According to a typical method of measuring spherical aberration, for example, the best focus for a 0.25-$\mu$m pattern and the best focus for a 2.0-$\mu$m pattern are measured. The difference between the measured best focuses is set as a measure that indicates the magnitude of spherical aberration. If, however, the size of a pattern to be transferred is large, the pattern can be resolved in a wide focus range. That is, since a large best focus range is allowed, it is difficult to determine an accurate best focus.

Astigmatism is a phenomenon in which the best focus shifts depending on the direction of a pattern to be transferred. As a method of measuring astigmatism, the method described in SPIE Vol. 1463 (1991), p. 294 is generally used. In this method, vertical, horizontal, and oblique patterns are exposed by micro-stepping while the focus condition is gradually changed. The focus conditions in which the patterns are resolved best in the vertical, horizontal, and oblique directions are compared by using an optical microscope. As in the case with the estimation of spherical aberration, in this method, as the size of a pattern to be transferred increases, high-precision estimation tends to be more difficult. Therefore, this method is effective for only fine patterns near the resolution limit.

Coma is a phenomenon in which the transfer position shifts depending on the size of a pattern to be transferred. According to a general method of measuring coma, since the size of a 5-bar pattern becomes different between its two ends after transfer, this size difference is used as a measure that indicates the magnitude of coma. Recently, a method of measuring the relative transfer position deviation of large and small patterns by using an overlay inspection tool has been used (Japanese Patent Application No. 9-305917).

The above conventional methods of measuring aberrations are generally used to estimate the influences of aberrations on actual device patterns. For this reason, as illumination and exposure conditions, conditions used to expose actual device patterns are used. In addition, as measurement marks to be formed on a substrate, marks close to the design rules of actual device patterns are formed.

According to these methods, however, since various aberrations influence each other in a complicated manner, each obtained estimation result is no more than relative estimation, e.g., "the influences of aberrations on a pattern B are smaller than those on a pattern A" or "the aberrations of an exposure tool A are smaller than those of an exposure tool B".

BRIEF SUMMARY OF THE INVENTION

At present, the influences of aberrations of a projection lens on actual device patterns cannot be neglected. For this reason, demand for process margin prediction by optical simulations in consideration of aberrations is growing as well as demand for an improvement in the performance of a projection lens by high-precision estimation techniques. That is, absolute estimation is strongly required for aberration estimation of projection lenses instead of relative estimation as in the prior art. In this specification, absolute estimation of aberrations indicates that the absolute values of coefficients representing the respective aberrations are measured on the basis of some aberration expression theory to be introduced into simulations.

The present invention has been made in consideration of the above situation, and has as its object to provide a method of measuring the aberrations of a lens, which can perform absolute estimation of the aberrations of a projection lens with high precision.

In order to achieve the above object, according to the present invention, a photo-mask is irradiated with an illumination beam through an illumination lens, an inspection mark on the photo-mask is imaged on a substrate through a projection optics, and a measurement mark which comprises a periodic pattern is provided on the substrate. A period P of the periodic pattern of the measurement mark is set to satisfy $$\lambda/\{NA(1-\sigma)\} \leq P \leq 3\lambda/\{NA(1+\sigma)\}$$

where NA is a numerical aperture of the projection lens, $\lambda$ is a wavelength of the illumination beam, and $\sigma$ is an illumination coherency factor.

The measurement mark is measured, and the aberration of the projection lens is estimated on the basis of the measurement result.

Depending on the size and shape of an actual device pattern, the predicted transfer position differs from the actual transfer position. In addition, the focus range in which patterns can be resolved shifts depending on the sizes and densities of the patterns. Furthermore, the focus range in which patterns can be resolved shifts depending on the directions of the patterns.

These phenomena involve complicated combinations of factors such as the aberrations of a projection lens, irregularities in the intensity of a secondary light source, illumination telecentricity, and an illumination coherency factor. It is therefore difficult to predict specific changes in actual device patterns.

Of these factors, according to the present invention, the period P of the periodic pattern of the measurement mark is set to satisfy $$\lambda/\{NA(1-\sigma)\} \leq P \leq 3\lambda/\{NA(1+\sigma)\}$$

This allows high-precision absolute estimation based on only the aberrations of a projection lens in a short period of time.

More specifically, the even function component and odd function component of wavefront aberration can be separately measured, and coma, spherical aberration, and astigmatism can be calculated by simple measurement and simple expressions. Lens aberration coefficients can therefore be calculated in the form that can be fed back to simulation of actual device patterns. In addition, since arbitrary wavefront aberration can be measured within a specific condition, high order aberrations, which cannot be estimated in the prior art, can be estimated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 18A, 18B, 18C, and 18D are schematic views showing a procedure for the second example of the present invention.

DETAILED DESCRIPTION OF THE INVENTION

An embodiment of the present invention will be described below with reference to the views of the accompanying drawing.

A basic arrangement for pattern transfer and the state of lens aberrations in pattern transfer will be described first.

Figure 1:
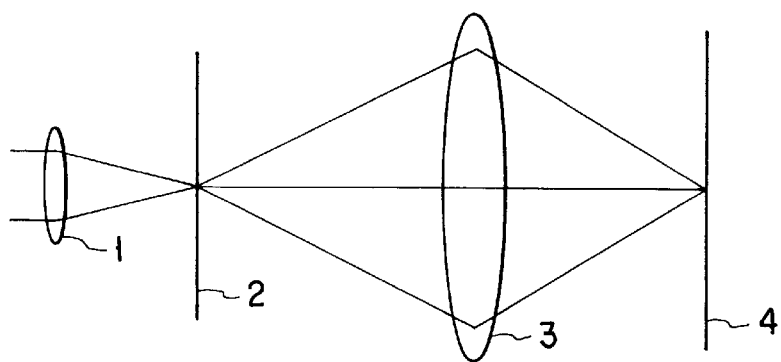
FIG. 1 is a schematic view showing how a pattern on a photo-mask is transferred onto a substrate.

FIG. 1 schematically shows how a pattern on a photo-mask is transferred onto a substrate.

As shown in FIG. 1, a pattern (not shown) on a photo-mask 2 is illuminated by an illumination optics 1 to be transferred onto a substrate 4 through a projection optics 3. The projection optics 3 has aberrations like those shown in FIG. 2. For this reason, the pattern (not shown) transferred on the substrate 4 blurs or is distorted, or the transfer position of the pattern shifts (image-shift).

Figure 2:
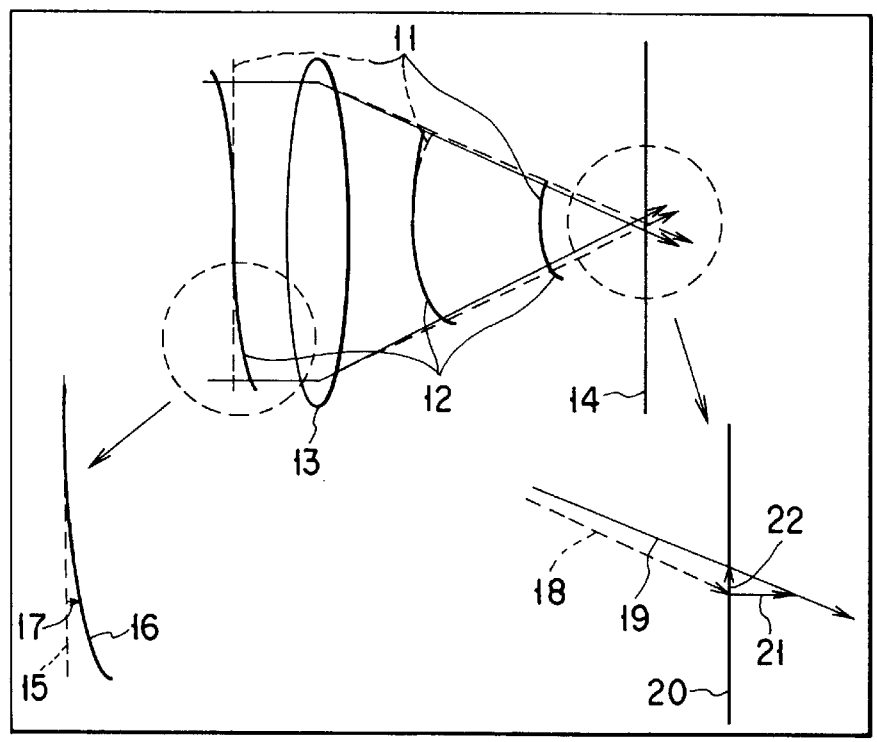
FIG. 2 is a view showing aberrations existing in a projection optical system.

FIG. 2 is a view for explaining the aberrations existing in the projection optics 3.

Referring to FIG. 2, reference numerals 11 and 15 denote ideal wavefronts having no aberration; 12 and 16, actual wavefronts having aberrations; 13, a projection lens; 14 and 20, image planes; 17, wavefront aberration; 18, an ideal beam with no aberration; 19, an actual beam with aberration; 21, longitudinal aberration; and 22, transverse aberration.

As shown in FIG. 2, the actual wavefronts 12 and 16 can be considered as wavefronts deviating from the ideal wavefronts 11 and 15. The difference between the ideal wavefront 15 and the actual wavefront is the wavefront aberration 17. The shape of the wavefront aberration 17 shows an aberration function.

In this case, a pupil function $P(R, \theta)$ can be expressed as $$P(R, \theta) = P_{ideal}(R) \exp \{2 \pi i W(R, \theta)\} \qquad (1)$$

"$W(R, \theta)$" in equation (1) is called an aberration function, which represents the degree of deviation of the actual wavefront from the ideal wavefront at a position $(R, \theta)$ on a pupil plane. Note that a pupil radius R is normalized with the numerical aperture (NA) of the projection lens and the outermost periphery of the pupil becomes 1.

The aberration function $W(R, \theta)$ can be analytically classified into phenomena called Seidel aberrations (spherical aberration, astigmatism, coma, field curvature, and distortion).

According to equation (1), the aberration function $W(R, \theta)$ is expressed as a pupil function at a specific position on the field. However, the actual aberration function is a function between the position $(R, \theta)$ on the pupil plane and the position $(r, \phi)$ on the field. For this reason, Seidel's five aberrations can be classified into a group that demands local estimation on the exposure field and a group that demands global estimation on the entire exposure field. The former includes spherical aberration, astigmatism, and coma, and the latter includes field curvature and distortion.

Field curvature can be estimated from the planar distribution of best focuses measured on the entire exposure field.

Distortion can be estimated from the planar distribution of pattern transfer position deviations measured on the entire exposure field.

Local aberrations (spherical aberration, astigmatism, and coma) correspond to the respective terms of R when the aberration function $W(R, \theta)$ is expanded into a series. More specifically, the coefficient of the fourth degree term without directionality ($R^4$) represents spherical aberration. When there is a difference in coefficient between the second degree terms in two orthogonal directions ($R^2$), it represents astigmatism. The coefficient of the third degree term ($R^3$) represents coma.

In addition, high order coefficients are expressed as high order spherical aberration, high order astigmatism, and high order coma. Estimating aberrations amounts to measuring the coefficients of the respective terms R when the aberration function is expanded into a series.

The present invention realizes high-precision aberration measurement by limiting the illumination conditions, the L/S ratio of a pattern (inspection mark) on the photo-mask 2, and a period P of a pattern (measurement mark) on the substrate 4 which is transferred from the photo-mask 2. The present invention will be described in more detail below.

[Illumination Conditions, Inspection Mark, and Measurement Mark]

Figure 3:
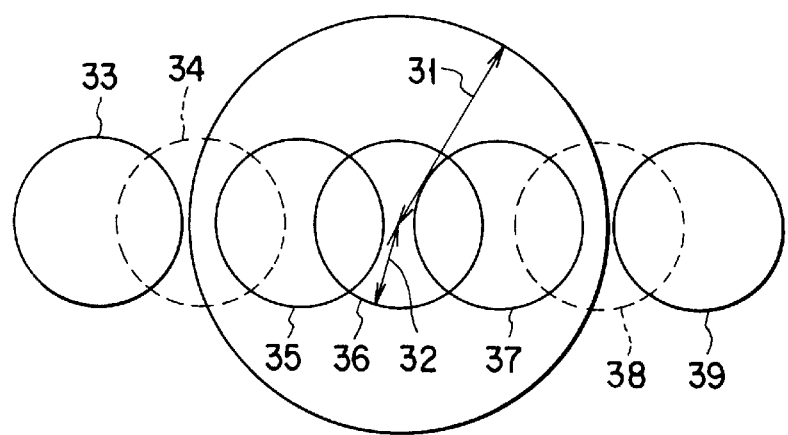
FIG. 3 is a view showing the distribution of diffracted beams on the pupil plane of a projection lens.

FIG. 3 shows the distribution of diffracted beams on the pupil plane of a projection lens.

The distribution of beams diffracted by a lines-and-spaces pattern (to be abbreviated as an L/S pattern hereinafter) can be illustrated, as in FIG. 3, in relation to an illumination coherency factor (to be referred to as an illumination coherency) σ.

Referring to FIG. 3, reference numeral 31 denotes the numerical aperture of the projection optics 3; 32, the numerical aperture of the illumination optics 1; 36, a 0th order diffracted beam; 37, 38, and 39, a +1st order diffracted beam, a +2nd order diffracted beam, and a +3rd order diffracted beam; and 35, 34, and 33, a −1st order diffracted beam, a −2nd order diffracted beam, and a −3rd order diffracted beam.

Using the numerical aperture 31 ($NA_{obj}$) and the numerical aperture 32 ($NA_{ill}$), the illumination coherency σ is expressed as $$\sigma = NA_{ill}/NA_{obj} \quad (2)$$

Figure 4A:
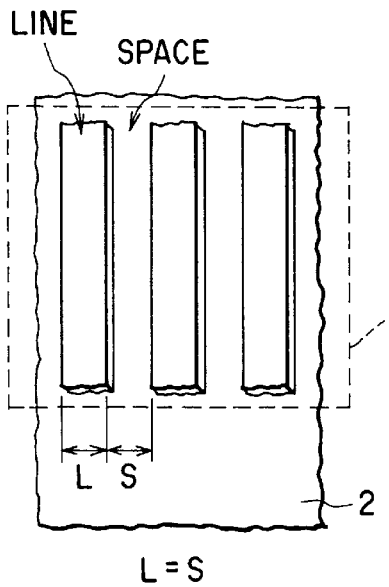
FIG. 4A is a plan view showing an inspection mark (L=S) according to the present invention.

If the inspection mark is an L/S pattern like the one shown in FIG. 4A, and the ratio of a line-width L to a space-width S is 1:1 (L=S), even order diffracted beams other than the 0th order diffracted beam do not exist according to the diffraction principle. Therefore, the orders of diffracted beams are "..., −5, −3, −1, 0, +1, +3, +5, ...". For this reason, when a pattern is to be formed by using only three beams, i.e., a 0th order diffracted beam and ±1st order diffracted beams, it suffices if ±3rd diffracted beams exist outside the numerical aperture $NA_{obj}$ (to be referred to as the NA hereinafter; NA is the numerical aperture of the projection lens 13), and ±1st order diffracted beams exist within the NA.

Figure 4B:
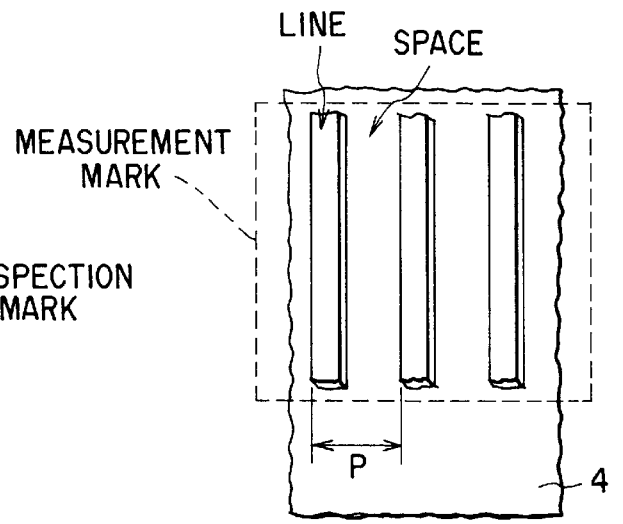
FIG. 4B is a plan view showing a measurement mark formed by using the inspection mark in FIG. 4A.

This condition can be satisfied when the period P of the measurement mark (FIG. 4B) transferred on the substrate 4 falls within the range defined by $$\lambda/\{NA(1-\sigma)\} \leq P \leq 3\lambda/\{NA(1+\sigma)\} \quad (3)$$

where λ is the wavelength of an illumination beam.

Figure 5A:
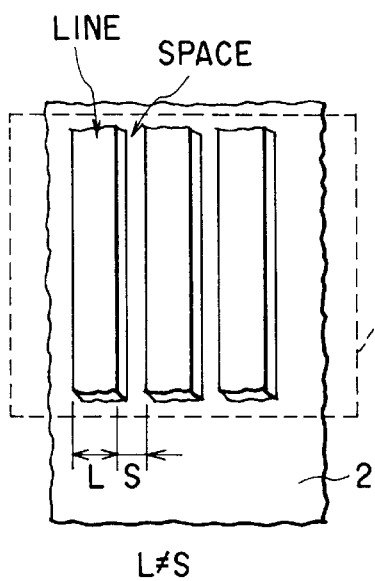
FIG. 5A is a plan view showing an inspection mark (L≠S) according to the present invention.

When the ratio L:S of the L/S pattern of the inspection mark is not 1:1 (L≠S), as shown in FIG. 5A, ±2nd diffracted beams also exist. When, therefore, a pattern is to be formed by using only three beams, it suffices if ±2nd diffracted beams exist outside the NA, and ±1st order diffracted beams exist within the NA.

Figure 5B:
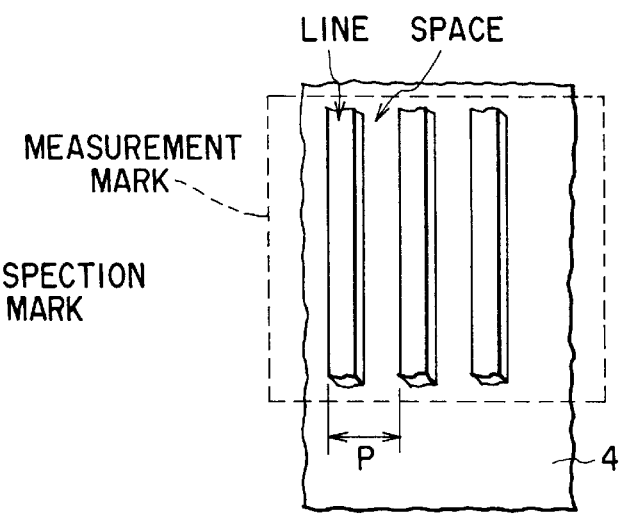
FIG. 5B is a plan view showing a measurement mark formed by using the inspection mark in FIG. 5A.

This condition can be satisfied when the period P of the measurement mark (FIG. 5B) transferred on the substrate 4 falls within the range defined by $$\lambda/\{NA(1-\sigma)\} \leq P \leq 2\lambda/\{NA(1+\sigma)\} \quad (4)$$

where λ is the wavelength of an illumination beam.

When the inspection mark on the photo-mask 2 has a periodic pattern like an L/S pattern, the distance (to be referred to as a pupil radius R in this specification) from the center of the pupil plane to the center of each of ±1st order diffracted beams is inversely proportional to the period P of the measurement mark.

When the NA is "1", the pupil radius R is the distance from the center of the pupil plane to the center of each of ±1st order diffracted beams and is given by $$R = \{1/P\}/\{NA/\lambda\} \quad (5)$$

Figure 6:
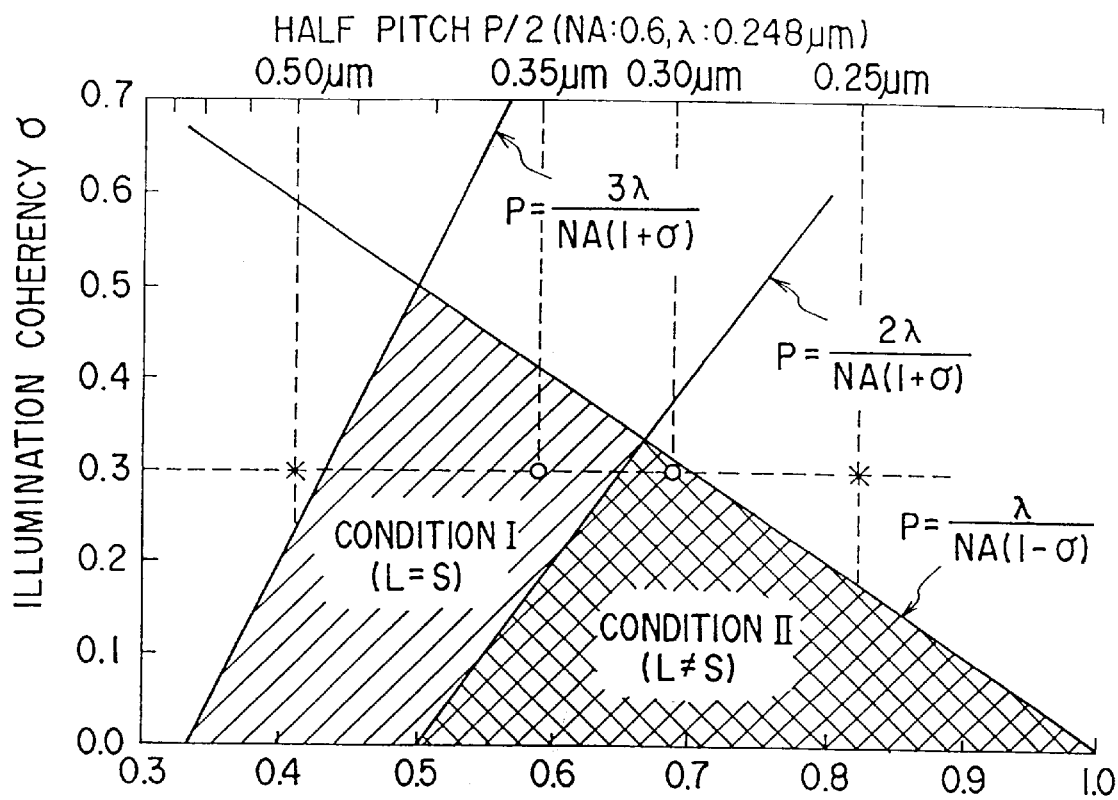
FIG. 6 is a graph showing the relationship between the illumination coherency σ, the pupil radius R, and the period P according to the present invention.

FIG. 6 shows the relationship between the illumination coherency σ, the pupil radius R, an the period P. Note that the relationship shown in FIG. 6 is obtained in a reduction-type exposure tool using a krypton fluoride excimer laser as an illumination source and a projection lens having an NA of 0.6.

As shown in FIG. 6, when the illumination coherency σ exceeds about 0.5, no state satisfied the conditions given by inequalities (3) and (4).

When the illumination coherency σ is equal to or lower than about 0.5, there are a state (I) in which the condition given by inequality (3) is satisfied and a state (II) in which the conditions given by inequalities (3) and (4) are satisfied at once.

In a region corresponding to the state (I), the condition given by inequality (3) is satisfied. If, therefore, the ratio L:S of the inspection mark is 1:1 (L=S), ±3rd diffracted beams exist outside the NA, and a 0th order diffracted beam and ±1st order diffracted beams exist within the NA.

In a region corresponding to the state (II), the conditions given by inequalities (3) and (4) are satisfied at once. Even if, therefore, the ratio L:S of the inspection mark is not 1:1 (L≠S), ±2nd order diffracted beams can exist outside the NA, and a 0th order diffracted beam and ±1st order diffracted beams can exist within the NA. That is, in the state (II), the ratio L:S may be either 1:1 or a value other than 1:1, and the dimensions of the inspection mark need not be limited to 1:1.

TABLE 1 indicates the range of periods P of inspection marks in which at least the condition given by inequality (3) can be satisfied, and which is found from the relationship in FIG. 6.

TABLE 1

| ILLUMINATION COHERENCY α | P/2 [MINIMUM–MAXIMUM] |
| --- | --- |
| 0.75 | NOT APPLICABLE |
| 0.45 | 0.375 μm–0.428 μm |
| 0.3 | 0.295 μm–0.477 μm |
| 0.15 | 0.243 μm–0.540 μm |

The step of exposing an L/S pattern on the photo-mask 2 under the condition of σ≦0.5 as shown in FIG. 6 and TABLE 1 has not been used much in the manufacture of a semiconductor device.

Consider σ=0.15 as a practical value. In this case, the use of a pattern having a size larger than a design rule for the estimation of aberrations of a reduction-type exposure tool targeted for the manufacture of semiconductor devices with a design rule of 0.25 μm or less is unprecedented.

Just focus will be described next.

[Just Focus]

Figure 7:
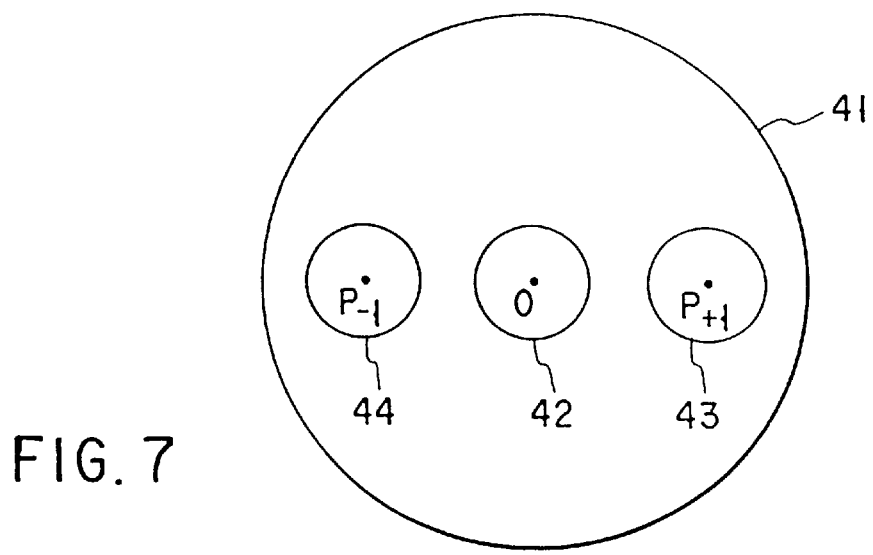
FIG. 7 is a view showing the distribution of diffracted beams on the pupil plane of the projection lens.

FIG. 7 shows the distribution of diffracted beams on the pupil plane of the projection lens.

Figure 8A:
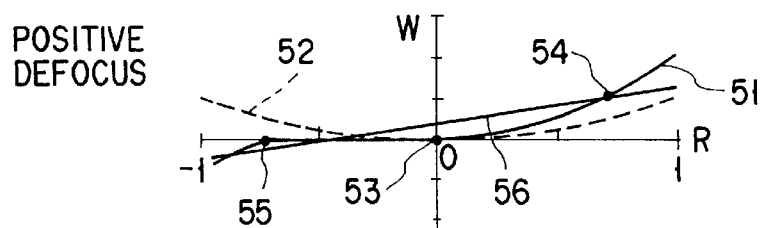
FIGS. 8A, 8B, and 8C are views each showing the relationship between a wavefront aberration and focus.
Figure 8B:
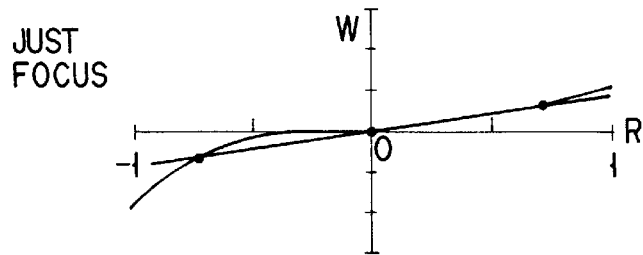
Figure 8C:
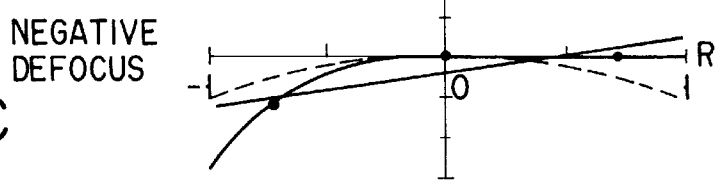

As shown in FIG. 7, with an inspection mark that satisfies the condition given by inequality (3) or (4), a 0th order diffracted beam 42, a +1st order diffracted beam 43, and a −1st order diffracted beam 44 exist within a circle 41 corresponding to the NA of the projection lens. Assuming that the wavefront aberrations inside the respective beams are almost constant, the wavefront aberration of the three beams can be represented by three points ($P_{-1}$, O, $P_{+1}$). FIGS. 8A to 8C respectively show the relationships between these three wavefront aberrations and defocuses.

A defocus amounts to adding a term multiplied by a coefficient corresponding to the $R^2$ defocus amount to the wavefront function of wavefront aberration. The addition of a constant term to the wavefront function is meaningless in terms of aberration. Therefore, each graph is so shifted that the wavefront aberration amount of the 0th order beam becomes 0 at all time. As shown in FIGS. 8A to 8C, therefore, a condition under which wavefront aberration 53 of a 0th order diffracted beam, wavefront aberration 54 of a +1st order diffracted beam, and wavefront aberration 55 of a −1st order diffracted beam are aligned can be obtained by changing a defocus 52 regardless of the shape of wavefront aberration 51. When this condition is satisfied (FIG. 8B), the projection lens focuses best, i.e., the best focus (jut focus) on this pattern is attained.

The slope of a straight line 56 obtained by least square fitting of these three points (53, 54, and 55) is proportional to the pattern position deviation amount, and its magnitude is constant relative to the defocus amount. The standard deviation from the straight line 56 reflects the degree of blur of the pattern.

In this manner, the L/S pattern of the inspection mark is imaged on the substrate by using only the three beams, i.e., the 0th and ±1st order diffracted beams. If, therefore, a standard focus is determined in advance, the average of wavefront aberrations of ±1st order diffracted beams at the time the wavefront aberration of a 0th order diffracted beam is "zero" can be determined from the difference between the standard focus and the just focus. In addition, the difference between the wavefront aberrations of the ±1st order diffracted beams can be determined from the pattern position deviation amount.

The average of these wavefront aberrations represents an even function component (spherical aberration or astigmatism, in particular) of the aberration function. The difference between the wavefront aberrations represents an odd function component (coma, in particular) of the aberration function.

In principle, a well adjusted projection lens has almost no wavefront aberration near its center, and wavefront aberrations that cause a deterioration in lithography characteristics concentrate on the peripheral portion of the lens. Therefore, a condition including a larger pupil radius R (the maximum value is 1) is a better condition for aberration estimation.

Assume that an inspection mark is transferred onto a photo-resist film applied on a substrate, and a measurement mark consisting of a photo-resist is formed on the substrate to be measured. In this case, the thickness of this photo-resist film is preferably minimized. This is because the use of an ultra-thin photo-resist film can reduce the influence of the chemical characteristics of the photo-resist on a measurement result, and consistent results can be obtained regardless of the type of photo-resist.

Examples of how coma, spherical aberration, and astigmatism are measured will be described below.

[Measurement of Coma]

Figure 10:
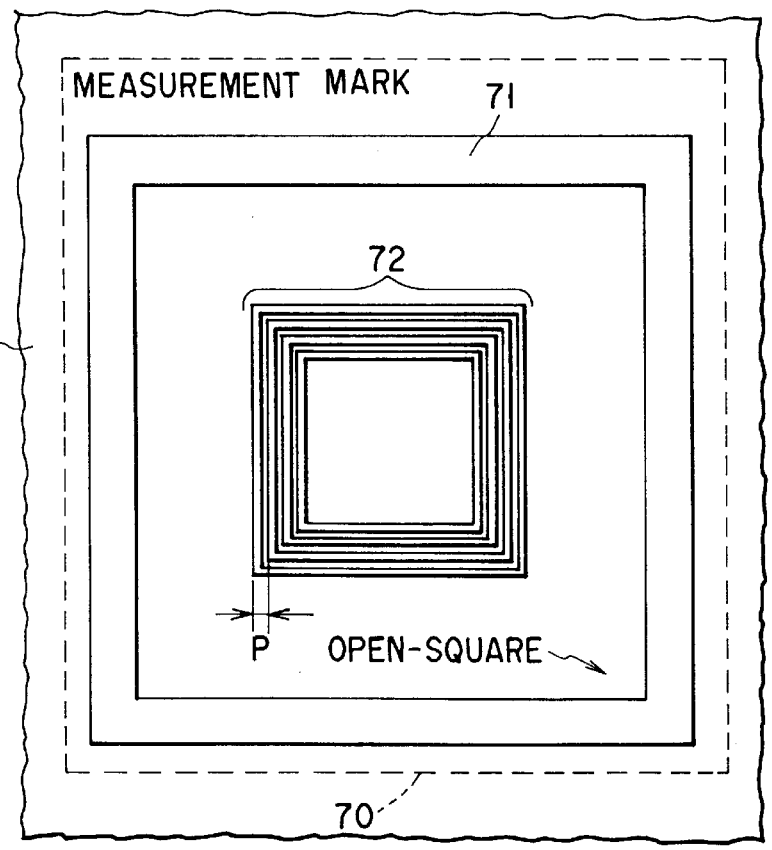
FIG. 10 is a plan view showing an example of a measurement mark used for the measurement of coma.
Figure 9:
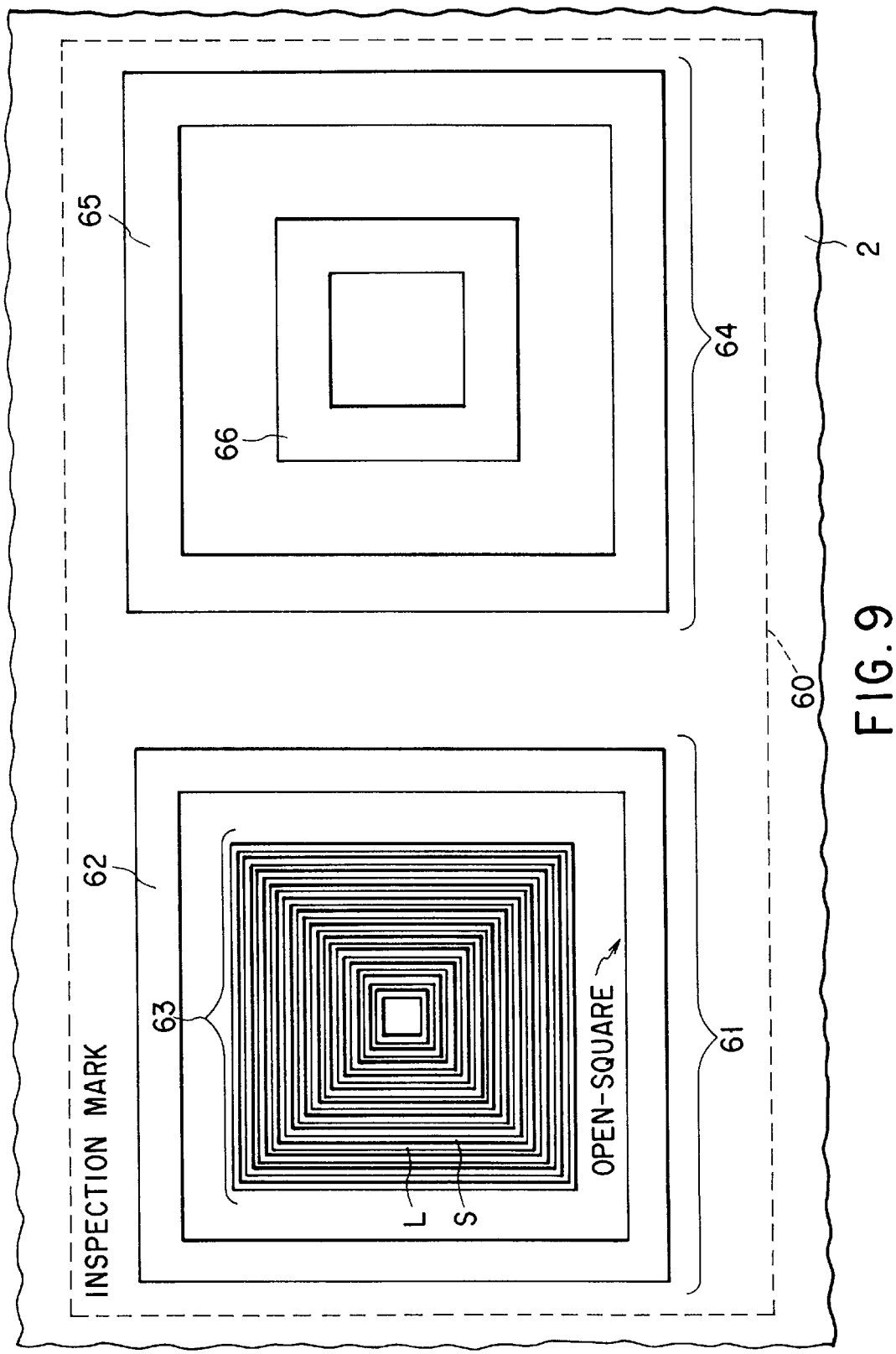
FIG. 9 is a plan view showing an example of an inspection mark used for the measurement of coma.

FIG. 9 is a plan view showing an example of an inspection mark used for the measurement of coma. FIG. 10 is a plan view showing the measurement mark formed on a substrate.

As shown in FIG. 9, an inspection mark 60 is formed on the photo-mask 2 and made up of first and second marks 61 and 64.

The mark 61 in FIG. 9 is made up of an open-square pattern 62 having a 2.0-$\mu$m wide open-square and an L/S pattern 63.

The mark 64 is made up of a pattern 65 covering the open-square pattern 62 and a pattern 66 partly covering the L/S pattern 63. The mark 64 is stacked on the mark 61 to extract only the central portion of the L/S pattern 63 excluding its outer and inner portions.

A measurement mark 70 in FIG. 10 is formed on the substrate 4 by exposing the mark 64 in FIG. 9 first, and then exposing the mark 64 again upon stacking it on the mark 61 (double-exposure).

The measurement mark 70 formed in this manner has an open-square pattern 71 corresponding to the open-square pattern 62 and an L/S pattern 72 corresponding to the central portion of the L/S pattern 63.

Note that the period P of the L/S pattern 72 satisfies the condition given by inequality (3) when the ratio L:S of the L/S pattern 63 is 1:1, and satisfies the condition given by inequality (4) when the ratio L:S of the L/S pattern 63 is not 1:1.

Subsequently, the relative transfer position deviation amount between the open-square pattern 71 and the L/S pattern 72 is measured by using a general overlay inspection tool.

According to Zernike's polynomials, 3rd order coma aberrations $Z_7$ and $Z_8$ are given by $$W(R, \theta) = Z_7(3R^2-2)R \cos\theta + Z_8(3R^2-2)R \sin\theta \quad (6)$$

The transfer position deviation of the open-square pattern 71 corresponds to the slope of equation (6) near its origin. For this reason, an aberration function corresponding to the transfer position deviation amount of the L/S pattern 72 relative to the open-square pattern 71 is expressed by an equation obtained by setting the slope of equation (6) at the origin to "zero". In this case, aberration functions in two orthogonal directions are expressed as $$W_X(R) = Z_7(3R^2-2)R$$

$$W_Y(R) = Z_8(3R^2-2)R \quad (7)$$

The position deviation amount of a large pattern corresponds to the slope of each equation (7) near its origin. For this reason, to measure aberration from the relative position of the large pattern, equations obtained by subtracting the tangent lines at the origins of equations (7) from equations (7) are preferably used as per $$W_X(R) = Z_7 \cdot 3R^3,$$

$$W_Y(R) = Z_8 \cdot 3R^3 \quad (8)$$

In addition, the pupil radius R with respect to the L/S pattern is expressed by a function of the period P:

$$R = \lambda/(P \cdot NA) \quad (9)$$

In this case, letting ($\delta_X$, $\delta_Y$) be the relative position deviation, then a wavefront aberration W can be expressed as $$(W_X, W_Y) = ((\delta_X/P)\cdot(\lambda/NA), (\delta_Y/P)\cdot(\lambda/NA)) \quad (10)$$

Therefore, coefficients representing Zernike's 3rd order coma aberrations can be expressed as $$Z_7 \sim (P^2/3)(NA^2/\lambda^3)\delta_X$$

$$Z_8 \sim (P^2/3)(NA^2/\lambda^3)\delta_Y \quad (11)$$

Furthermore, high order aberrations can be measured as follows. A plurality of samples are obtained by changing the period P of the L/S pattern 72 within the condition given by inequality (3) or (4). Then, the measurement results on these samples are fitted by the least-squares method into $$W(R)=aR^3+bR^5+cR^7+ \quad (12)$$

[Measurement of Spherical Aberration]

Figure 11:
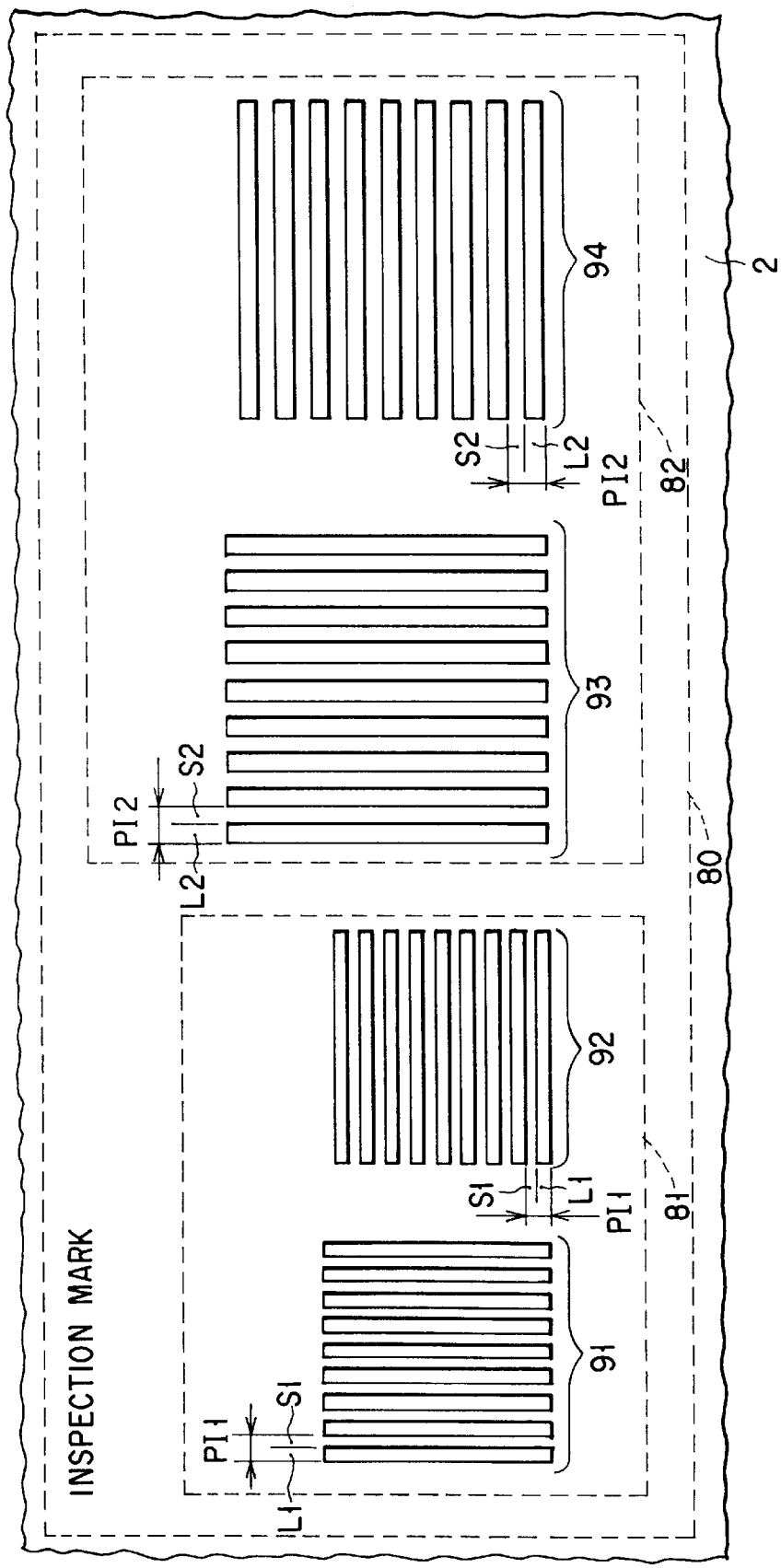
FIG. 11 is a plan view showing an example of an inspection mark used for the measurement of spherical aberration.
Figure 12:
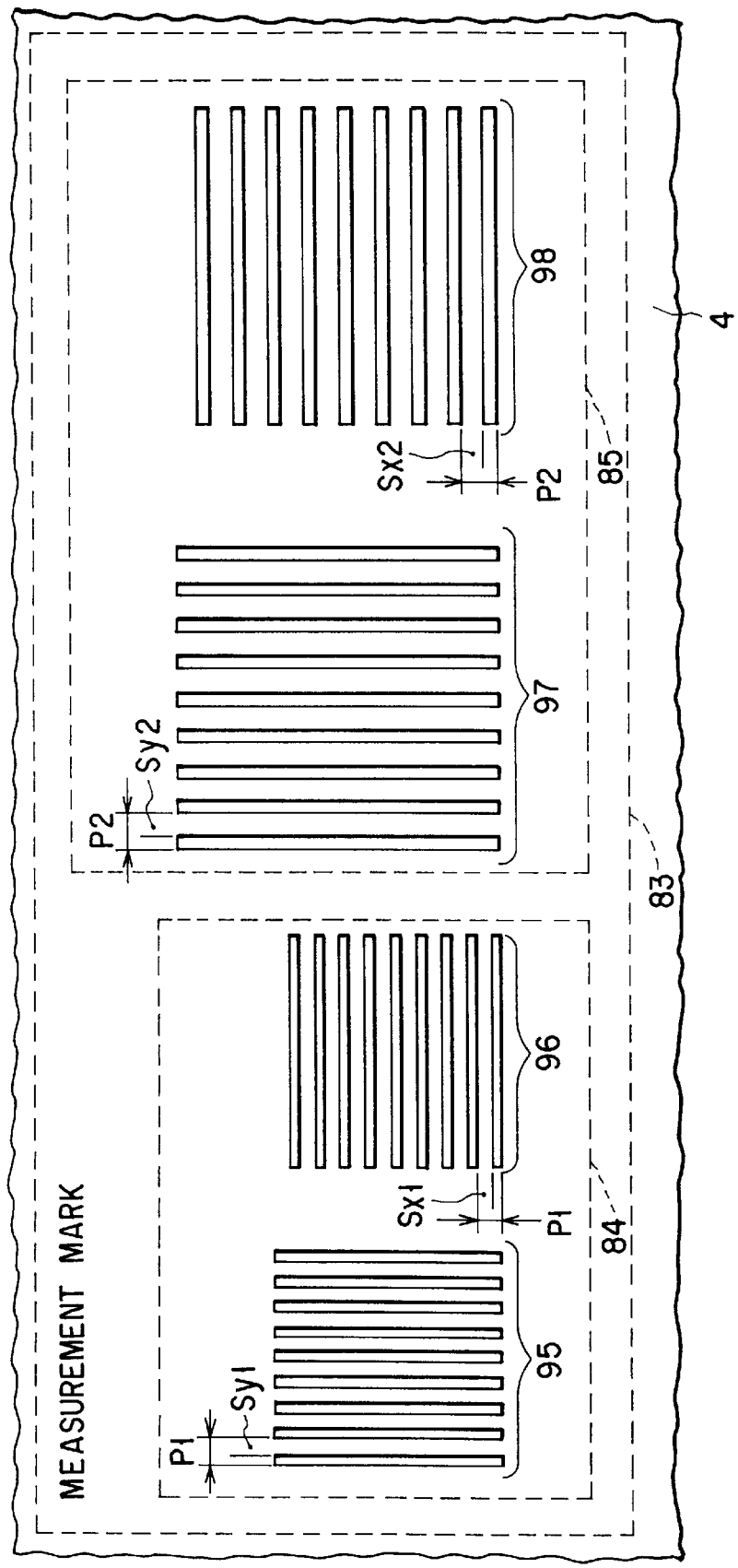
FIG. 12 is a plan view showing an example of a measurement mark used for the measurement of spherical aberration.

FIG. 11 is a plan view showing an example of an inspection mark used for the measurement of a spherical aberration. FIG. 12 is a plan view showing an example of a measurement mark formed on a substrate.

As shown in FIG. 11, an inspection mark 80 is made up of two types of patterns 81 and 82 having different periods PI (the period of the smaller pattern is $PI_1$, and the period of the larger pattern is $PI_2$). The pattern 81 in this case includes a vertical L/S pattern 91 and a horizontal L/S pattern 92. Similarly, the pattern 82 includes a vertical L/S pattern 93 and a horizontal L/S pattern 94.

A plurality of measurement marks each identical to a measurement mark 83 in FIG. 12 are formed on the substrate 4 by sequentially exposing the inspection mark 80 in FIG. 11 while micro-stepping the substrate 4 and changing the focus in units of micro-steps with the exposure amount being fixed. The details of this processing will be described later.

Each measurement mark 83 formed in this manner includes a pattern 84 corresponding to the pattern 81 and a pattern 85 corresponding to the pattern 82. In addition, the pattern 84 includes L/S patterns 95 and 96 respectively corresponding to the L/S patterns 91 and 92. The pattern 85 includes L/S patterns 97 and 98 corresponding to the L/S patterns 94 and 94.

The period P1 of the L/S patterns 95 and 96 and the period P2 of the L/S patterns 97 and 98 satisfy the condition given by inequality (3) when the ratio L:S (L1:S1) of the L/S patterns 91 and 92 and the ratio L:S (L2:S2) of the L/S patterns 93 and 94 are 1:1.

The period P1 of the L/S patterns 95 and 96 and the period P2 of the L/S patterns 97 and 98 satisfy the condition given by inequality (4) when the ratio L:S (L1:S1) of the L/S patterns 91 and 92 and the ratio L:S (L2:S2) of the L/S patterns 93 and 94 are not 1:1.

Subsequently, space-widths $S_y1$, $S_x1$, $S_y2$, and $S_x2$ of the L/S patterns 95, 96, 97, and 98 are measured by using a scanning electron microscope (SEM).

When the space-widths $S_y1$, $S_x1$, $S_y2$, and $S_x2$ are measured, the measured values have a maximum as the focus changes, and symmetrical changes in space-widths with respect to ±defocuses are observed. Admittedly, this tendency becomes noticeable as the illumination coherency σ decreases or the thickness of the photo-resist film decreases. Variations in the space-widths $S_y1$, $S_x1$, $S_y2$, and $S_x2$ are subjected to least square fitting with a second-order function with respect to the focus. The resultant maximum value can be determined as the just focus for the pattern 81 or 82.

The above dimensions do not always vary symmetrically with respect to +defocuses. In general, they do not vary symmetrically. As described above, however, with a reduction in the illumination coherency σ, the symmetry of variations in dimension with ±defocuses tend to be enhanced. This phenomenon can be easily understood from FIGS. 7 and 8A to 8C.

The diffracted beams obtained by a periodic pattern correspond to the respective diffraction orders on a pupil plane and have a diffracted beam distribution with the same shape as that obtained with the illumination coherency σ. Assume that a transfer pattern is to be imaged by using only three beams, i.e., a 0th order diffracted beam and ±1st order diffracted beams, and wavefront aberrations are nearly constant within the illumination coherency σ shapes of the respective diffracted beams. In this case, the wavefront aberrations at the points O, $P_{+1}$, and $P_{-1}$ representing the respective diffracted beams change as shown in FIGS. 8A to 8C with a change in focus. More specifically, the wavefront aberrations at the points always align themselves at some focus position, and the wavefront aberrations at the points $P_{+1}$ and $P_{-1}$ symmetrically change with ±defocuses. The focus attained when the wavefront aberrations at these three points align themselves is the just focus. In addition, since the resolution of the pattern is essentially proportional to the variance from the approximate straight line obtained by approximating the wavefront aberrations at the three points, the resolution obtained by equally defocusing the lens in the positive and negative directions always remains the same. If, however, wavefront aberrations are distributed within the same illumination coherency σ, since this condition is not satisfied, the symmetry with ±defocuses deteriorates. To make the wavefront aberrations approach a constant value within the same illumination coherency σ, the illumination coherency σ may be reduced. That is, the symmetry of variations in dimension with ±defocuses can be enhanced by reducing the illumination coherency σ.

In addition, the focus margin expressed within the focus range in which a pattern is resolved steeply increases as the period of the pattern increases. This indicates that the just focus determination precision steeply decreases with an increase in pattern size. As the illumination coherency σ decreases, the pattern contrast at the just focus position increases, but the focus margin tends to decrease. Obviously, when the illumination coherency σ is set to be small, the just focus position determination precision improves. According to a simulation, when the illumination coherency σ is set to 0.15, the maximum pattern period that can be measured is about 0.95 μm.

A 4th order spherical aberration $Z_9$ in Zernike's polynomials is expressed by $$W(R)=Z_9 \cdot (6R^4-6R^2+1) \quad (13)$$

When aberration is to be estimated from the focus difference, since the second term of equation (13), i.e., the second degree term cannot be easily distinguished from the focus, equation (13) is preferably replaced by $$W(R)=Z_9 \cdot 6R^4+C \quad (14)$$

where C is an arbitrary constant.

Figure 13:
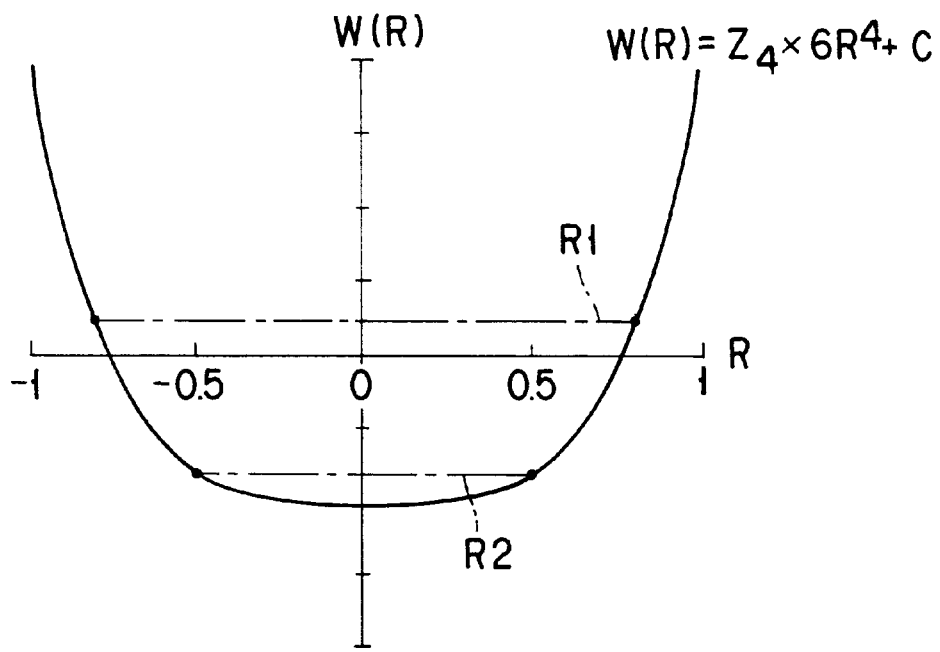
FIG. 13 is a graph showing the relationship between wavefront aberration and spherical aberration.

Letting $\pm R_1$ be the radii of ±1st order beams corresponding to the L/S patterns 91 and 92 having the period $PI_1$, $\pm R_2$ be the radii of ±1st order beams corresponding to the L/S patterns 93 and 94 having the period $PI_2$, and $\delta_1$ and $\delta_2$ be the measured focus positions, as shown in FIG. 13, we have $$(NA^2/2\lambda) \, \delta_1 R_1^2 = 6Z_9 R_1^4 + C$$

$$(NA^2/2\lambda) \, \delta_2 R_2^2 = 6Z_9 R_2^4 + C \quad (15)$$

Since the difference between the measured focus positions is given by $\delta_F = \delta_2 - \delta_1$, the spherical aberration $Z_9$ can be expressed by $$Z_9 = (\delta_F/12\lambda)(NA^2/(R_2^2-R_1^2)) \quad (16)$$

Furthermore, high order aberrations can be measured as follows. Two or more types of samples are obtained by changing the period $P_1$ of the L/S patterns 95 and 96 and the period $P_2$ of the L/S patterns 97 and 98 within the condition given by inequality (3) or (4). Then, the measurement results on these samples are fitted by the least-squares method into $$W(R) = aR^4 + bR^6 + cR^8 + \ldots \quad (17)$$

[Measurement of Astigmatism]

Figure 14:
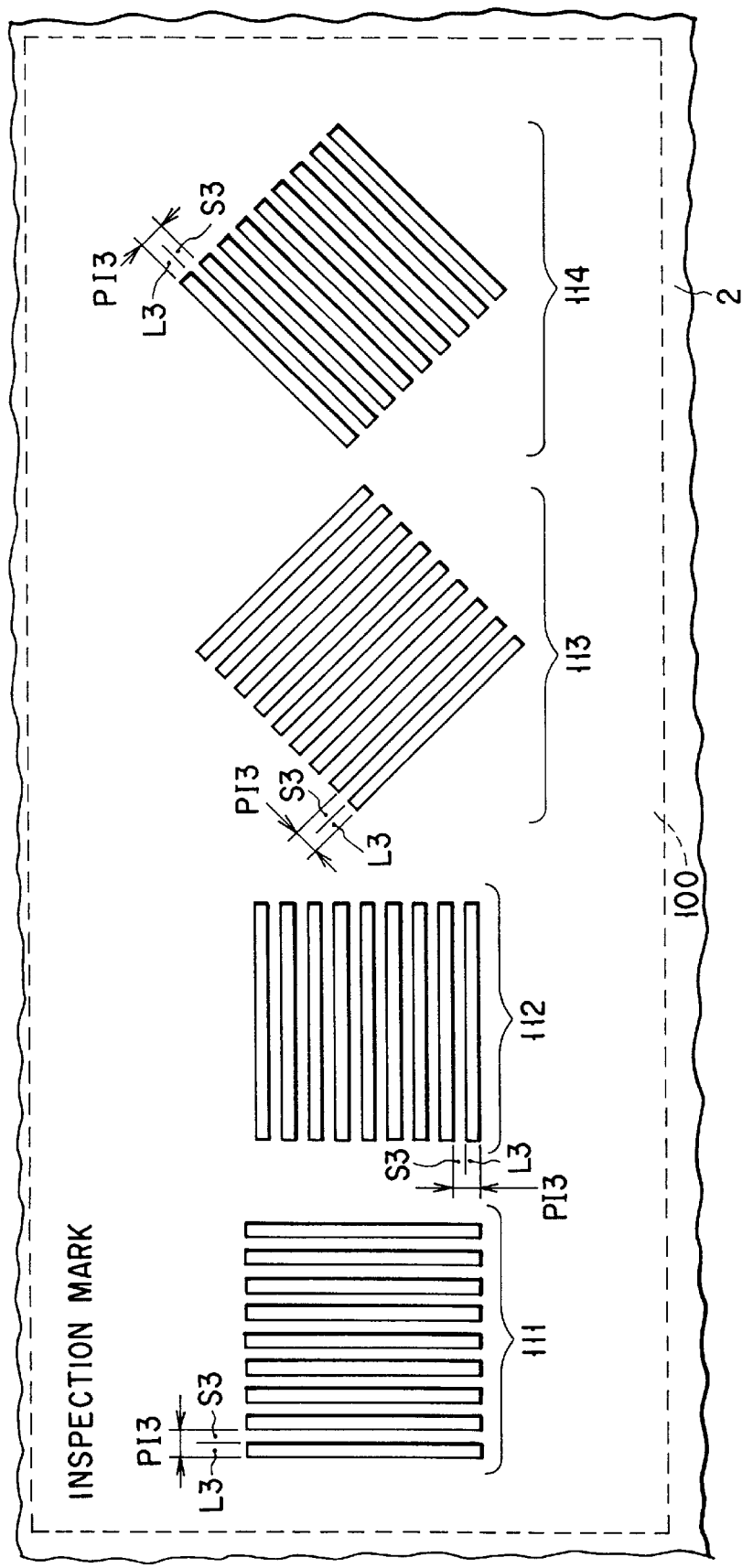
FIG. 14 is a plan view showing an example of an inspection mark used for the measurement of astigmatism.
Figure 15:
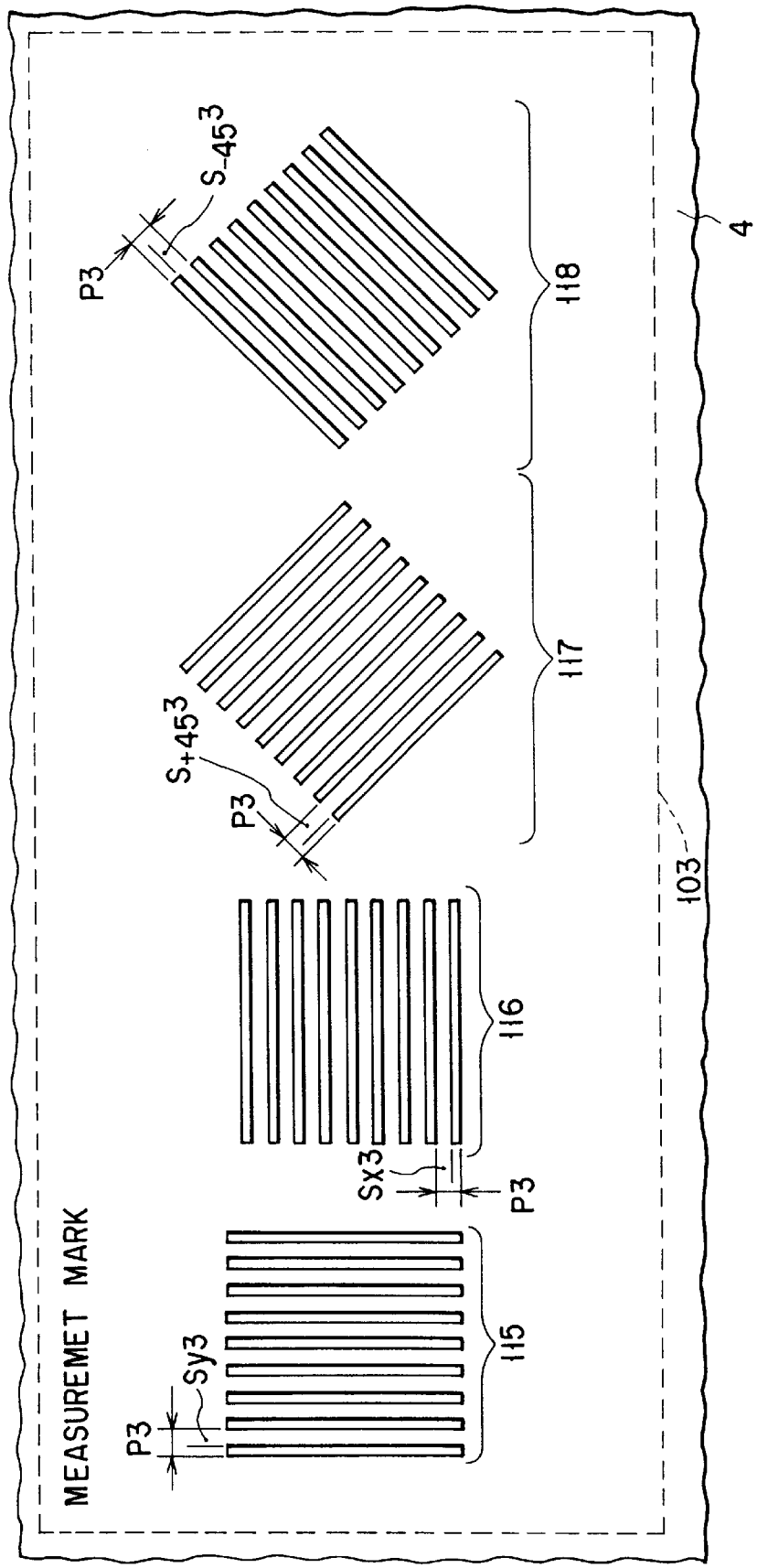
FIG. 15 is a plan view showing an example of a measurement mark used for the measurement of astigmatism.

FIG. 14 is a plan view showing an example of an inspection mark used for the measurement of astigmatism. FIG. 15 is a plan view showing a measurement mark formed on a substrate.

An inspection mark 100 in FIG. 14 is made up of a vertical L/S pattern 111, a horizontal L/S pattern 112, a +45° L/S pattern 113, and a −45° L/S pattern 114. These L/S patterns 111 to 114 have the same period, a period P13.

A plurality of measurement marks each identical to measurement mark 103 in FIG. 15 are formed on the substrate 4 by sequential exposure using the inspection mark 100 in FIG. 14 while micro-stepping the substrate 4 and changing the focus in units of micro-steps with the exposure amount being fixed. The details of this processing will be described later.

Each measurement mark 103 formed in this manner includes patterns 115 to 118 respectively corresponding to the patterns 111 to 114.

A period P3 of the L/S patterns 115 to 118 satisfies the condition given by inequality (3) when the ratio L:S (L3:L3) of the L/S patterns 111 to 114 is 1:1.

The period P3 of the L/S patterns 115 to 118 satisfies the condition given by inequality (4) when the ratio L:S (L3:L3) of the L/S patterns 111 to 114 is not 1:1.

Subsequently, space-widths $S_y3$, $s_x3$, $S_{+45}3$, and $S_{-45}3$ of the L/S patterns 115 to 118 are measured by using the SEM.

The terms having coefficients $Z_5$ and $Z_6$ representing astigmatism in Zernike's polynomials are expressed by $$W(R, \theta) = Z_5 \cdot R^2 \cos 2\theta + Z_6 \cdot R^2 \sin 2\theta \quad (18)$$

As in the case with the measurement of spherical aberrations, when the just focus is measured with the pattern in each direction, and the focus position differences between the vertical and horizontal patterns 111 and 112 and between the +45° and +45° patterns 113 and 114 are respectively represented by $\delta F_5$ and $\delta F_6$, the astigmatism aberrations $Z_5$ and $Z_6$ are given by $$Z_5 = (\delta F_5/4\lambda)(NA^2)$$

$$Z_6 = (\delta F_6/4\lambda)(NA^2) \quad (19)$$

Furthermore, high order aberrations can be measured as follows. A plurality of types of samples are obtained by changing the period $P_3$ of the L/S patterns 115 to 118 within the condition given by inequality (3) or (4). Then, the measurement results on these samples are fitted by the least-squares method into $$W(R) = aR^2 + bR^4 + cR^6 + \ldots \quad (20)$$

Several examples of the present invention will be described below.

[FIRST EXAMPLE]

FIGS. 16A to 16D schematically show a procedure for the first example.

Figure 16A:
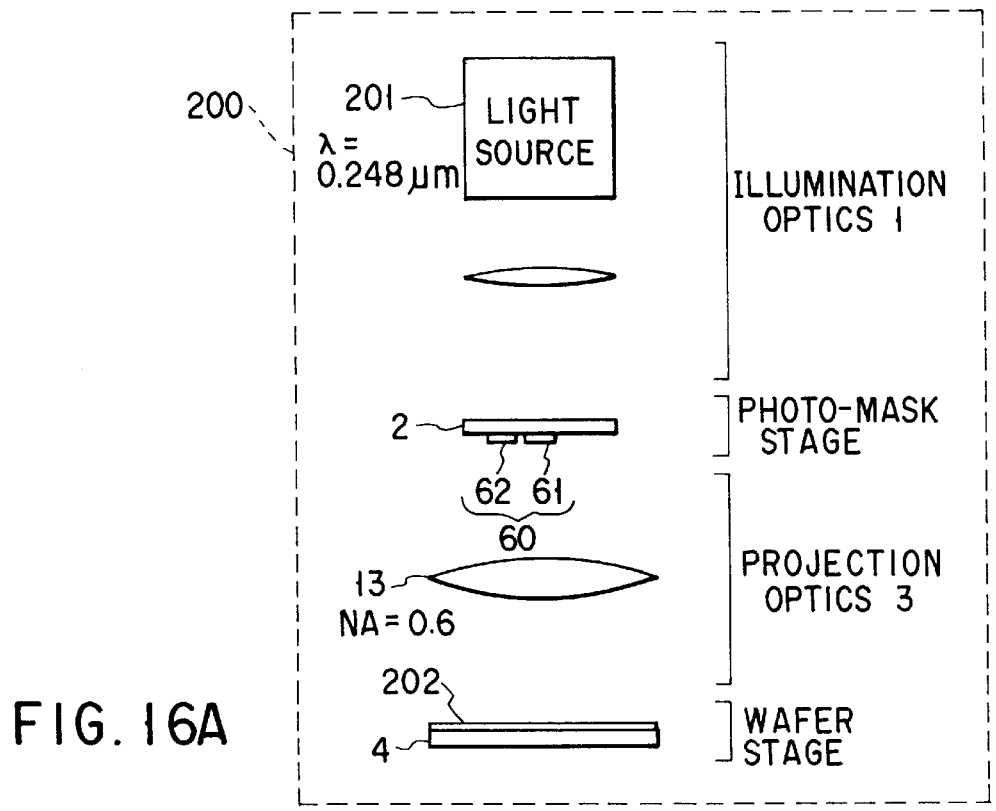
FIGS. 16A, 16B, 16C, and 16D are schematic views showing a procedure for the first example of the present invention.

First of all, as shown in FIG. 16A, a photo-mask 2 and a substrate (to be referred to a wafer hereinafter) 4 are set on a reduction-type projection exposure tool 200. A light source 201 of this tool 200 is a krypton fluoride excimer laser, and the wavelength λ of an illumination beam is 0.248 μm. The NA of a projection lens 13 is 0.6. A plurality of inspection marks each identical to the inspection mark 60 in FIG. 9 are formed on the photo-mask 2. For example, 33 (=3×11) inspection marks 60 are located in an illumination field of the photo-mask 2. The upper surface of the substrate 4 is coated with a 60-nm thick anti-reflection film (For example, AR3 available from Syplay; not shown). A 0.3-μm thick positive-tone photo-resist (For example, S210J available from JSR) 202 is applied on the film.

Figure 16B:
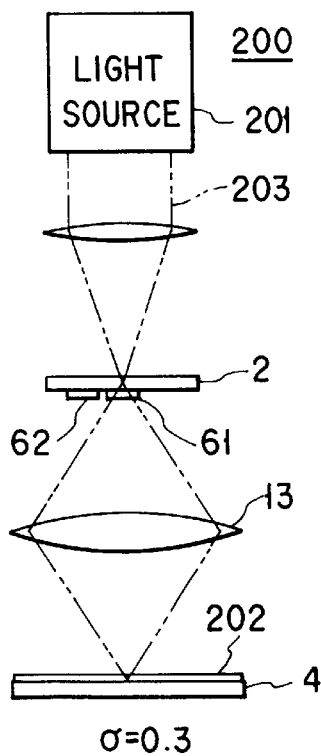

Subsequently, as shown in FIG. 16B, the photo-mask 2 is irradiated with an illumination beam 203 through the illumination lens 1 to expose the photo-resist 202. For example, the exposure amount is 16 mJ/cm². In addition, the illumination coherency σ is set to 0.3. With this operation, the inspection marks 60 are imaged on the photo-resist 202.

Figure 16C:
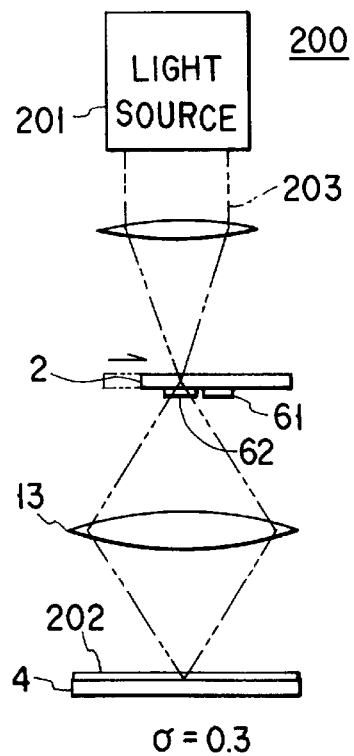

As shown in FIG. 16C, the photo-mask 2 is shifted to superimpose each mark 62 on a corresponding mark 61, and the photo-resist 202 is exposed again (double-exposure). For example, the exposure amount at this time is 10 mJ/cm².

Figure 16D:

After double-exposure, as shown in FIG. 16D, the positive-tone photo-resist 202 is developed by using a 0.21N TMAH developer as shown in FIG. 16D to obtain measurement marks each identical to the measurement mark 70 shown in FIG. 10. In a 25 mm (horizontal)×8 mm (vertical) exposure field, 33 (11×3) measurement marks are formed.

Figure 17:
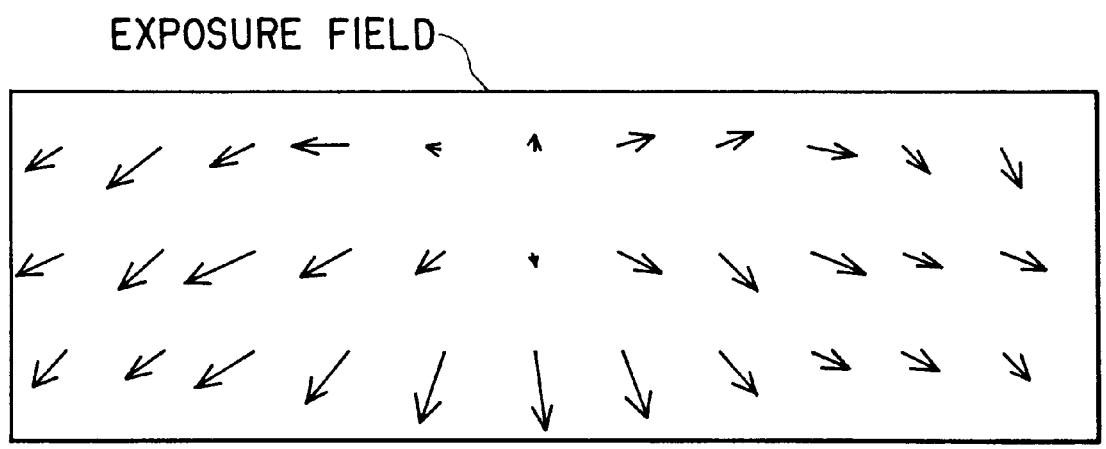
FIG. 17 is a view showing a measurement result on coma aberrations.

After this process, the wafer 4 (sample), on which the 33 measurement marks 70 were formed, was measured by using an overlay inspection tool. More specifically, the relative position deviation amount of patterns 71 and 72 was measured. FIG. 17 shows the measurement result. The maximum position deviation vectors indicated 20 nm at maximum. By substituting this maximum value $\delta_X$=20 nm into equation (10), the coma of the projection lens 13 is calculated as 0.12 λ.

[Second Example]

FIGS. 18A to 18D schematically show a procedure for the second example.

As in the procedure shown in FIG. 16A, a photo-mask 2 and a wafer 4 are set on the tool 200. An inspection mark 80 in FIG. 11 is formed on the photo-mask 2 used in the second example. The upper surface of the wafer 4 is coated with a 60-nm thick anti-reflection film (AR3 available from Syplay; not shown). A 0.3-μm thick positive-tone photo-resist (S210J available from JSR) 202 is applied on the film.

Subsequently, as shown in FIG. 18A, the photo-mask 2 is irradiated with an illumination beam 203 through an illumination lens 1 to expose the photo-resist 202. For example, the exposure amount is 10 mJ/cm². With this operation, the inspection mark 80 is imaged on the photo-resist 202 . An exposure amount of 10 mJ/cm² is slightly smaller than the exposure amount at which an L/S pattern whose period P is 0.3 μm or 0.45 μm is formed to have a ratio L:s of 1:1. The illumination coherency σ is set to 0.15.

As shown in FIGS. 18B and 18C, the positive-tone photo-resist 202 is exposed while the wafer 4 is micro-stepped and the focus is changed 0.01 μm at a time. The exposure amount is fixed to 10 mJ/cm².

After exposure is performed a predetermined number of times, the photo-resist is developed to obtain a plurality of measurement marks 83 (83-1 to 83-3), as shown in FIG. 18D.

After this process, the wafer 4, on which the plurality of measurement marks 83 were formed, was measured by using a SEM. More specifically, the space-widths of the measurement marks 83 were measured by using the SEM. Variations in dimension with a change in focus were subjected to least square fitting with a second-order function with respect to the focus position. The resultant maximum value was determined as a just focus for the corresponding pattern. When the just focuses for all the types of patterns were compared with each other, the difference δF between the average of the just focuses for the patterns 91 and 92 and that of the patterns 93 and 94 was 120 nm. By substituting this measurement result into equation (16), the aberration $Z_9$ was calculated as 0.02 λ.

[Third Example]

As a procedure for the third example is common to that shown in FIGS. 18A to 18D, the procedure will be described below with reference to FIGS. 18A to 18D (Note that an inspection mark 100 and a measurement mark 103 are equivalent to the inspection mark 80 and the measurement mark 83, respectively).

As shown in FIGS. 18A to 18C, a photo-resist 202 is exposed under the conditions of λ=0.248 μm, NA=0.6, and σ=0.15 while the wafer 4 is micro-stepped and the focus is changed 0.01 μm at a time with the exposure amount being fixed to 10 mJ/cm².

After exposure is performed a predetermined number of times, the photo-resist 202 is developed to obtain a measurement mark 103 corresponding to an inspection mark 100, as shown in FIG. 18D.

After this process, the wafer 4, on which the plurality of measurement marks 103 were formed, was measured by using a SEM. More specifically, the space-widths of the measurement marks 103 and the just focuses were measured. As a result, a focus position difference $δF_5$ between the vertical and horizontal patterns 111 and 112 was 60 nm, and a focus position difference $δF_6$ between +45° and −45° patterns 113 and 114 was 80 nm. By substituting the measurement results into equation (19), $Z_5$=0.02 λ and $Z_6$=0.03 λ were calculated.

The embodiments of the present invention have been described above. However, the present invention is not limited to these embodiments, and various changes and modifications can be made within the spirit and scope of the invention.

For example, the inspection mark 80 in FIG. 11 has vertical and horizontal patterns. However, this mark may include only vertical or horizontal patterns.

In addition, although the inspection mark 80 is used for the measurement of spherical aberration, this mark can also be used for the measurement of coma. In this case, for example, the difference between the transfer position of the pattern 91 and that of the pattern 93 or the difference between the transfer position of the pattern 92 and that of the pattern 93 may be measured.

According to the present invention, coma, spherical aberration, astigmatism can be calculated by simple measurements and simple expressions. This allows high-precision absolute evaluation of lens aberrations in a short period of time on the basis of only the aberrations of a projection lens. In addition, the aberrations of the projection lens can be measured while the lens is mounted on the exposure tool.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of measuring aberration of a projection lens, comprising:
   irradiating a photo-mask with an illumination beam through an illumination optics;
   imaging an inspection mark, which comprises a periodic pattern on the photo-mask, on a substrate through a projection optics;
   providing a measurement mark, which comprises a periodic pattern corresponding to the periodic pattern of the inspection mark, on the substrate, a period P1 of the periodic pattern of the measurement mark satisfying $$\lambda/\{NA(1-\sigma)\} \leq P1 \leq 3\lambda/\{NA(1+\sigma)\}$$

where NA is a numerical aperture of the projection lens, λ is a wavelength of the illumination beam, and σ is an illumination coherency factor; and
   measuring the measurement mark and estimating the aberration of the projection lens on the basis of the measurement result.

2. A method according to claim 1, wherein the periodic pattern of the inspection mark is a lines-and-spaces pattern.

3. A method according to claim 2, wherein a line-width of the periodic pattern of the inspection mark is substantially equal to a space-width of the periodic pattern of the inspection mark.

4. A method according to claim 1, wherein the period P1 of the periodic pattern of the measurement mark further satisfies $$\lambda/\{NA(1-\sigma)\} \leq P1 \leq 2\lambda/\{NA(1+\sigma)\}$$

5. A method according to claim 4, wherein the periodic pattern of the inspection mark is a lines-and-spaces pattern, and
   a line-width of the periodic pattern of the inspection mark differs from a space-width of the periodic pattern of the inspection mark.

6. A method according to claim 1, wherein the inspection mark further comprises an open-square pattern having an open-square provided with the periodic pattern, and
   the measurement mark further comprises an open-square pattern corresponding to the open-square pattern of the inspection mark.

7. A method according to claim 6, further comprising the step of measuring a difference between a position of the open-square pattern of the measurement mark and a position of the periodic pattern of the measurement mark, and estimating a coma aberration of the projection lens on the basis of the measurement result.

8. A method according to claim 1, wherein the inspection mark further comprises a second periodic pattern, and
   the measurement mark further comprises a second periodic pattern corresponding to the periodic pattern of the inspection mark, and
   a period P2 of the second period pattern of the measurement mark satisfies $$\lambda/\{NA(1-\sigma)\} \leq P2 \leq 3\lambda/\{NA(1+\sigma)\}$$

and differs from the period P1.

9. A method according to claim 8, further comprising the step of measuring a difference between a position of the periodic pattern of the measurement mark and a position of the second periodic pattern of the measurement mark, and estimating a coma aberration of the projection lens on the basis of the measurement result.

10. A method according to claim 8, further comprising the step of providing a plurality of measurement marks each identical to the measurement mark on the substrate by changing a focus.

11. A method according to claim 9, further comprising the step of measuring a difference between a just focus for the periodic pattern of the measurement mark and a just focus for the second periodic pattern of the measurement mark, and estimating a spherical aberration of the projection lens on the basis of the measurement result.

12. A method according to claim 1, wherein the inspection mark further comprises a third periodic pattern, the measurement mark further comprises a third periodic pattern corresponding to the third periodic pattern of the inspection mark, and a period P3 of the third measurement pattern is substantially equal to the period P1 but different in direction.

13. A method according to claim 12, further comprising the step of providing a plurality of measurement marks each identical to the measurement mark on the substrate by changing a focus.

14. A method according to claim 13, further comprising the step of measuring a difference between just focus for the periodic pattern of the measurement mark and just focus for the third periodic pattern of the measurement mark, and estimating an astigmatism aberration of the projection lens on the basis of the measurement result.

* * * * *